United States Patent [19]
Jin

[11] Patent Number: 5,668,489
[45] Date of Patent: Sep. 16, 1997

[54] DEAD-TIME GENERATING CIRCUIT

[75] Inventor: Sang-hyun Jin, Seoul, Rep. of Korea

[73] Assignee: Samsung Electronics, Co., Ltd., Suwon, Rep. of Korea

[21] Appl. No.: 581,911

[22] Filed: Jan. 2, 1996

[51] Int. Cl.⁶ .................................................. H03K 3/017
[52] U.S. Cl. ............................................ 327/173; 327/175
[58] Field of Search ................................ 327/173, 175

[56]           References Cited
          U.S. PATENT DOCUMENTS 5,003,194   3/1991   Englehard ........................ 327/173

*Primary Examiner*—Margaret Rose Wambach
*Attorney, Agent, or Firm*—Burns, Doane, Swecker & Mathis, LLP

[57]                ABSTRACT

A dead-time generating circuit includes a first gate for generating a gate signal corresponding to a predetermined cutting width, and a second gate for cutting an input signal to be cut by the gate signal by the predetermined cutting width determined by a user and outputting the result. Therefore, an arbitrary block of a pulse width modulated (PWM) signal (whatever it may be in a logic "high" or "low") applied to the inverter of an AC servo driving circuit can be cut constantly by a predetermined cutting width. Also, the cutting width can be adjusted easily by the user.

4 Claims, 5 Drawing Sheets

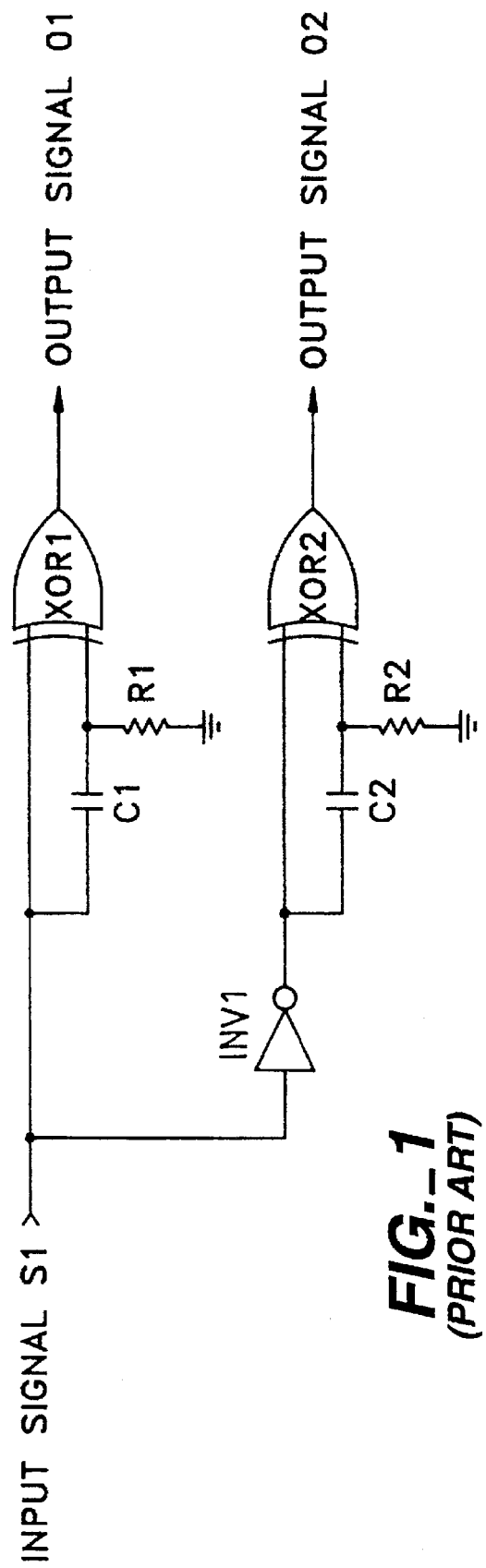
FIG._1
(PRIOR ART)

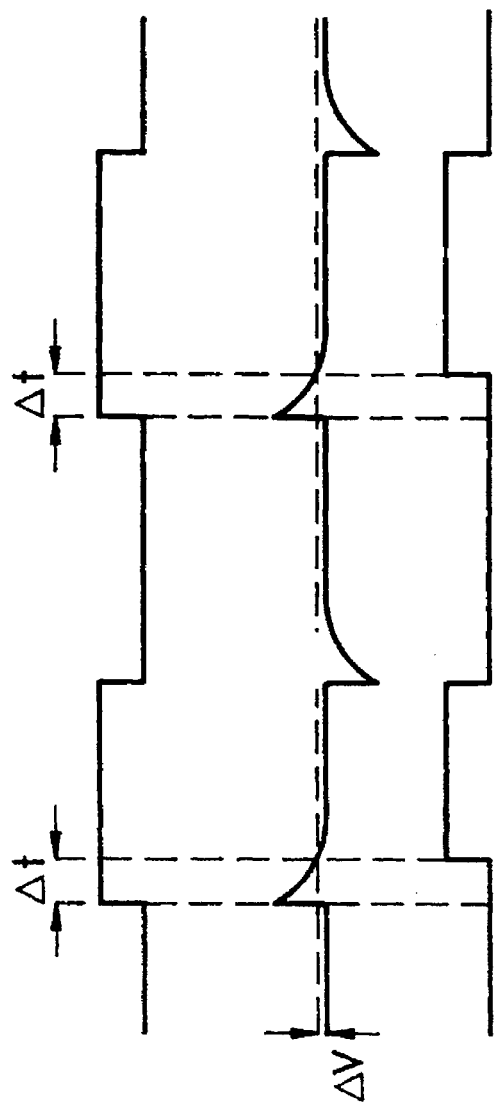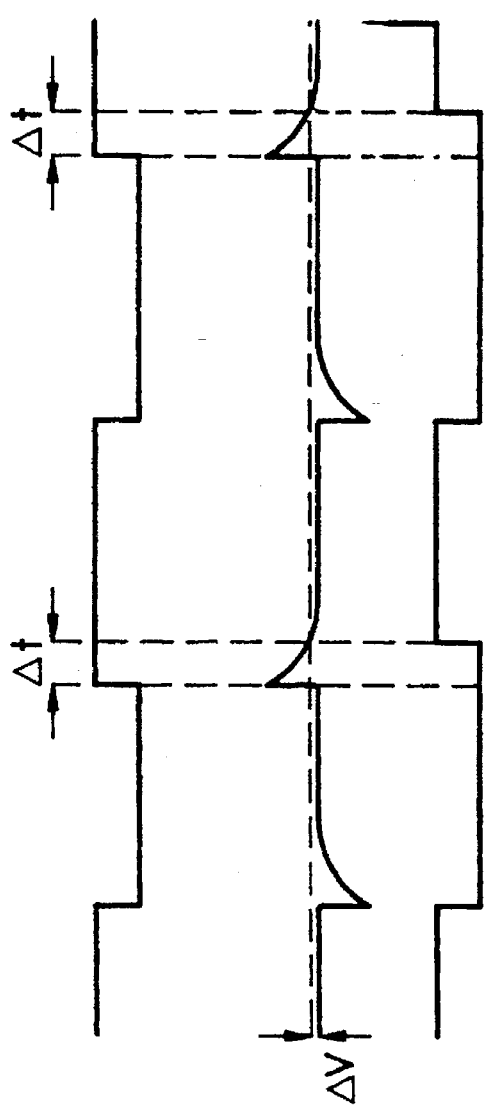
FIG._2A (PRIOR ART)
FIG._2B (PRIOR ART)
FIG._2C (PRIOR ART)
FIG._2D (PRIOR ART)
FIG._2E (PRIOR ART)
FIG._2F (PRIOR ART)

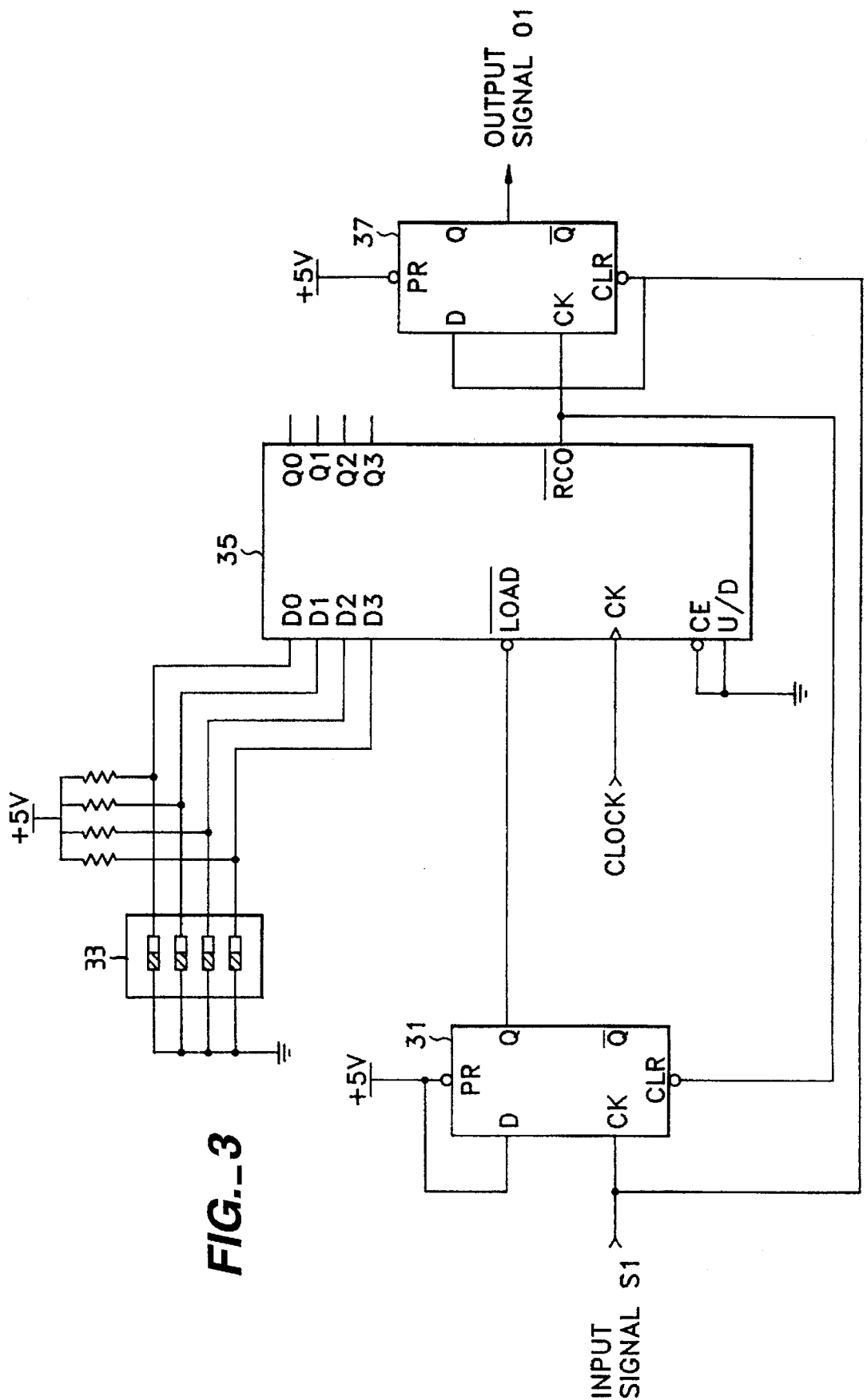
FIG._3

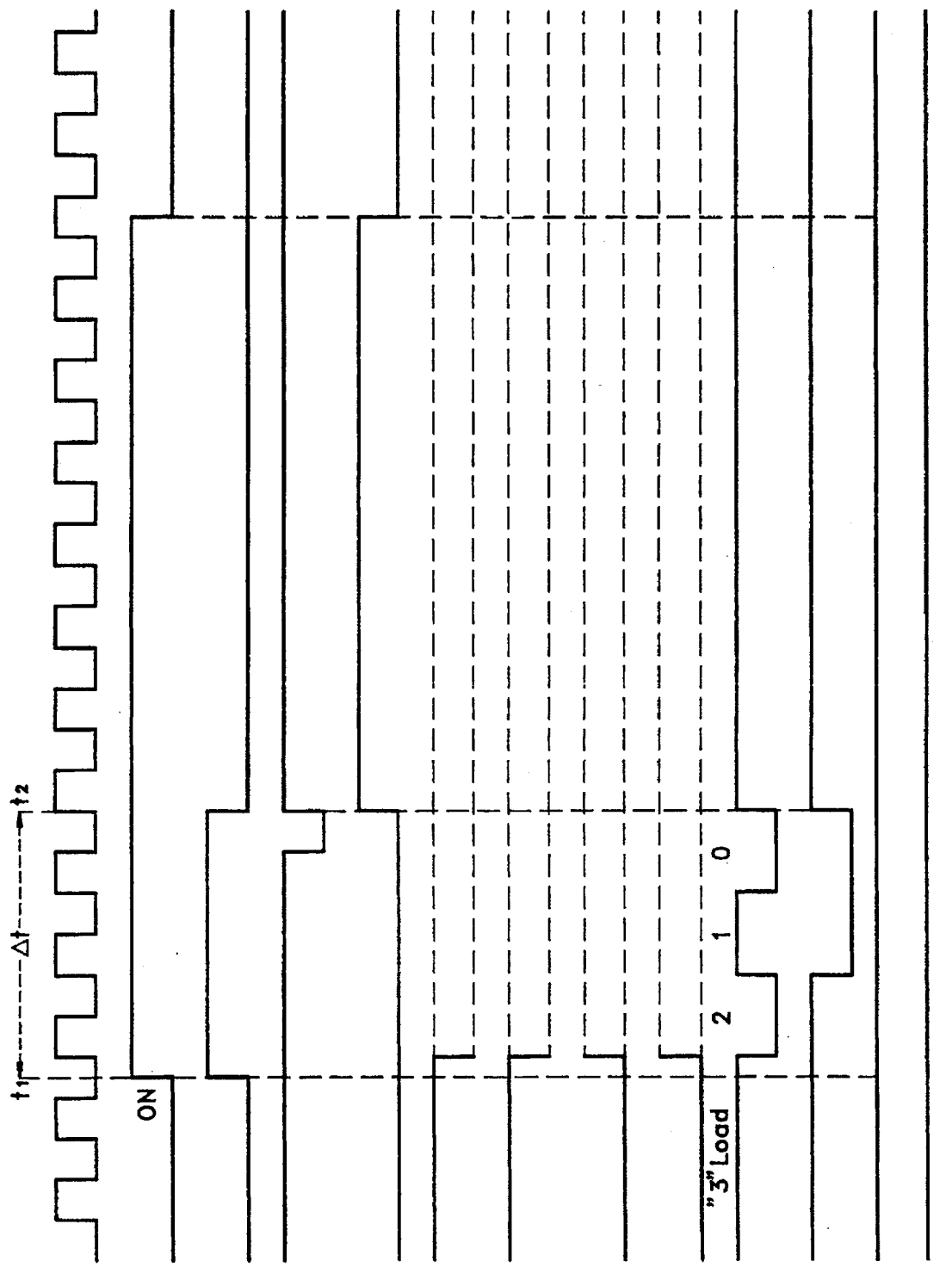

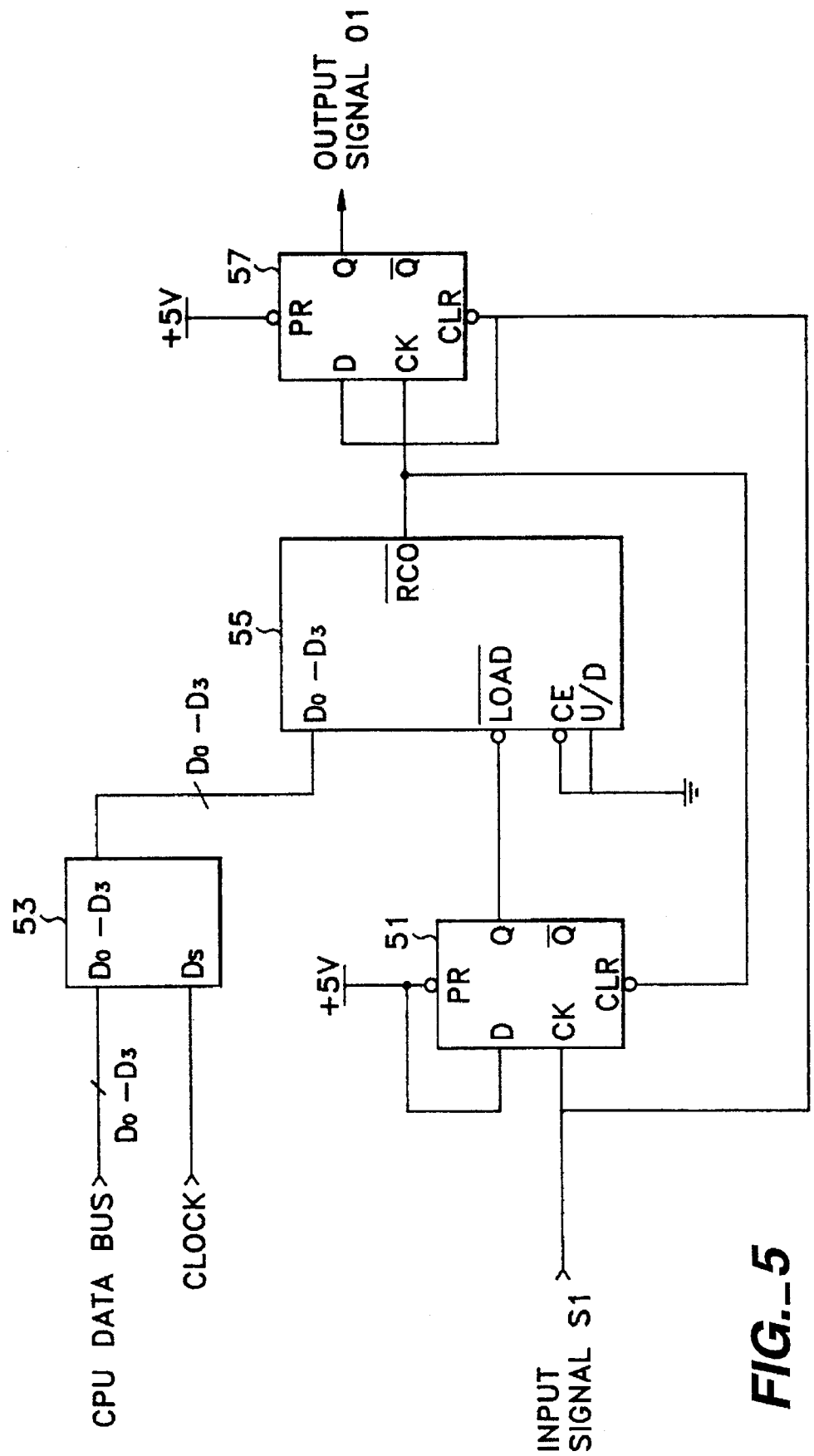
FIG._5

DEAD-TIME GENERATING CIRCUIT

BACKGROUND OF THE INVENTION

The present invention relates to a circuit for cutting-off a pulse width modulated (PWM) signal applied to an inverter by an arbitrary width of pulses to protect the inverter (referred to herein as a dead-time generating circuit).

FIG. 1 shows a conventional dead time generating circuit, and FIGS. 2A through 2F are operational timing diagrams of for respective parts in FIG. 1. The dead-time generating circuit shown in FIG. 1 will now be described with reference to the timing diagrams shown in FIGS. 2A through 2F.

An input signal S1 (FIG. 2A) is input to a first input port of a first exclusive OR gate XOR1 and a signal (FIG. 2B) obtained by differentiating the input signal S1 by a capacitor C1 and a resistor R1 is input to a second input port thereof.

Therefore, in first exclusive OR gate XOR1, a value of the differential signal (FIG. 2B) higher than ΔV is recognized as a logic "high." Thus, a signal (an output signal O1) whose logic "high" portion corresponding to Δt is cut from the original input signal S1 (FIG. 2A) is output, as shown in FIG. 2C.

A signal (FIG. 2D) obtained by inverting the input signal S1 (FIG. 2A) by an inverter INV1 is input to a first input port of a second exclusive OR gate XOR2 and a signal (FIG. 2E) obtained by differentiating the inverted signal (FIG. 2D) by a capacitor C2 and a resistor R2 is input to a second input port thereof.

Like in first exclusive OR gate XOR 1, in second exclusive OR gate XOR2, a value of the differential signal (FIG. 2E) higher than ΔV is recognized as a logic "high." Thus, a signal (an output signal O2) whose logic "high" portion corresponding to Δt is cut from the original inverted signal (FIG. 2D) is output, as shown in FIG. 2F.

As described above, in the conventional dead-time generating circuit, exclusive OR operations are executed with respect to an input signal and the signal differentiated by a capacitor and a resistor to cut the forehead of the logic "high" portion of the input signal. However, since the value of Δt is changed depending on the change in capacitance or resistance value due to ambient temperature or humidity, it is difficult to cut the logic "high" portion of the input signal with a constant interval. Also, the value of Δt can be only changed by replacing the capacitor or resistor.

SUMMARY OF THE INVENTION

It is an object of the present invention to provide a dead-time generating circuit for cutting a PWM signal applied to an inverter by an arbitrary width of pulses in order to protect the inverter.

To accomplish the above object, there is provided a dead-time generating circuit according to a first embodiment of the present invention comprising:

a first gate means for generating a gate signal corresponding to a predetermined cutting width determined by a user; and a second gate means for cutting-off an input signal to be cut-off by the gate signal by the predetermined time interval and outputting the result.

To accomplish the above object, there is provided a dead-time generating circuit according to a second embodiment of the present invention comprising:

a first D-flipflop for receiving an input signal to be cut by a predetermined time interval at a clock port, receiving a logic "high" state at a preset port and a D-input port, and applying a first gate signal to a clear port, to output a second gate signal;

an up/down counter for starting counting operation by the second gate signal, down-counting counted input values loaded to N data input ports by a predetermined clock signal to output counted output values, and outputting the first gate signal generated when the counted output values are 0;

a means for discretionarily adjusting the counted input values corresponding to the time interval; and a second D-flipflop for receiving the first gate signal at a clock port, and receiving a logic "high" state at a D-input port and a clear port, and receiving a logic "high" state at a preset port, to output a signal obtained by cutting-off the input signal by the time interval.

BRIEF DESCRIPTION OF THE DRAWINGS

The above objects and advantages of the present invention will become more apparent by describing in detail preferred embodiments thereof with reference to the attached drawings in which:

FIG. 1 is a circuit diagram of a conventional dead-time generating circuit;

FIGS. 2A through 2F are operational timing diagram for respective parts in FIG. 1;

FIG. 3 is a circuit diagram of a dead-time generating circuit according to a first embodiment of the present invention;

FIGS. 4A through 4M are operational timing diagram of various parts in FIG. 3; and FIG. 5 is a circuit diagram of a dead-time generating circuit according to a second embodiment of the present invention.

DETAILED DESCRIPTION OF THE INVENTION

The circuit shown in FIG. 3 includes a first D-flipflop (DFF1) 31 for receiving an input signal S1 to be cut by a predetermined time interval at a clock port (CK), receiving a logic "high" state at a preset port (PR) and a D-input port, and receiving a first gate signal at a clear port (CLR), to output a second gate signal, an up/down counter 35 for receiving the second gate signal at a load port ($\overline{\text{LOAD}}$) and down-counting counted input values loaded to N for example, 4 data input ports (D0~D3) by a predetermined clock signal to output counted output values through 4 data output ports (Q0~Q3) and outputting the first gate signal generated in the output port ($\overline{\text{RCO}}$) when the counted output values are 0, a switch 33 for discretionarily adjusting the counted input values loaded to the data input ports of up/down counter 35, and a second D-flipflop (DFF2) 37 for receiving the first gate signal output from up/down counter 35 at a clock port (CK), receiving the input signal S1 at a D-input port and a clear port (CLR), and receiving a logic "high" state at a preset port (PR), to output a signal obtained by cutting-off the input signal S1 by the predetermined time-interval. Here, in the up/down counter 35, a count enabling port (CE) and an up/down mode port (U/D) are grounded and accordingly up/down counter 35 performs the down counting.

FIGS. 4A through 4M are operational timing diagrams for the respective parts in FIG. 3. FIG. 4A illustrates the clock signal of up/down counter 35, FIG. 4B illustrates the input signal S1 applied to the clock port (CK) of first D-flipflop (DFF1) 31 and to the input port (D) and clear port (CLR) of second D-flipflop (DFF2) 37, FIG. 4C illustrates the second gate signal, that is, a counting start signal output from the output port (Q) of first D-flipflop (DFF1) 31, FIG. 4D illustrates the signal at the output port ($\overline{RCO}$) of up/down counter 35, and FIG. 4E illustrates the signal at the output port (Q) of second D-flipflop (DFF2) 37. FIGS. 4F through 4I illustrate the counted input values applied to the data input ports D0 through D3 of up/down counter 35, and FIGS. 4J through 4M illustrate the counted output values output from the data output ports Q0 through Q3 of up/down counter 35.

FIG. 5 is a circuit diagram of a dead-time generating circuit according to a second embodiment of the present invention, which includes a first D-flipflop (DFF1) 51, an up/down counter 55 and a second D-flipflop (DFF2) 57, like in the first embodiment. However, the circuit includes a latch 53 for inputting the count input values adjusted in a microcomputer (not shown) to N data input ports of up/down counter 55, instead of switch 33 in FIG. 3 which is used in the first embodiment.

The operation of the present invention will now be described with reference to FIGS. 3 through 5.

First, according to the first embodiment of the present invention shown in FIG. 3, the signal (FIG. 4C) at the output port Q of first D-flipflop (DFF1) 31 is in a logic "low" state initially, and the input signal S1 (FIG. 4B) applied to the clock port CK is in a logic "low" state. Here, the clock signal (FIG. 4A) of up/down counter 35 must be a signal having the frequency of at least one cycle within the logic "high" portion of the input signal S1 (FIG. 4B).

For the sake of convenient explanation, it is assumed that the clock signal (FIG. 4A) having the frequency of several tens times that of the input signal S1 (FIG. 4B) is input to the clock port CK of up/down counter 35, the signals (FIGS. 4F and 4G) of the logic "high" states are applied to the data input ports D0 and D1 of up/down counter 35 and the signals (FIGS. 4H and 4I) of the logic "low" states are applied to the data input ports D2 and D3, respectively, so that the value of 3HEX is finally loaded to the data input ports D0 through D3 of up/down counter 35.

If the input signal S1 (FIG. 4B) becomes a logic "high" state at a time t1, the counting start signal of the logic "high" state is output from the output port Q of first D-flipflop (DFF1) 31, as shown in FIG. 4C. Up/down counter 35 functions as a down-counter by the counting start signal.

Since the value of 3HEX is loaded to the data input ports D0 through D3 of up/down counter 35, down-counting starts from 3HEX and the counting is performed by the clock signal (FIG. 4A) input to the clock port CK of up/down counter 35. At a time t2 when the counted values at the data output ports Q0 through Q3 of up/down counter 35 reach 0HEX, as shown in FIGS. 4J through 4M, the signal shown in FIG. 4D is output from the output port ($\overline{RCO}$) of up/down counter 35.

The signal (FIG. 4D) output from the output port ($\overline{RCO}$) of up/down counter 35 is input to the clock port CK of second D-flipflop (DFF2) 37 and to the clear port CLR of first D-flipflop (DFF1) 31 to reset first D-flipflop (DFF1) 31 so that the output port Q becomes the logic "low" state, thereby stopping the operation of up/down counter 35 and simultaneously making the output port Q of second D-flipflop (DFF2) 37 a logic "high" state.

In other words, the signal (the output signal O1 in FIG. 4E) of the output port Q of second D-flipflop (DFF2) 37 is obtained by cutting-off the input signal S1 by $\Delta t$. The time-interval ($\Delta t$) is adjusted by the value loaded to the data input ports D0 through D3 of up/down counter 35. Also, the value loaded to the data input ports D0 through D3 can be arbitrarily set by a user's manipulation of switch 33. Here, switch 33 may take the form of a dual-in-line (DIP) package.

The second embodiment of the present invention shown in FIG. 5 is different from the first embodiment in that the values loaded to the data input ports D0 through D3 of up/down counter 55 are adjusted not by switch 33 but by latch 53. In other words, the data whose value is adjusted by the microcomputer (not shown) is loaded to the data input ports D0 through D3 of up/down counter 55.

As described above, in the dead-time generating circuit according to the present invention, an arbitrary portion of a pulse width modulated (PWM) signal (whatever it may be in a logic "high" or "low") applied to the inverter of an AC servo driving circuit can be cut-off constantly by a predetermined time interval. Also, the time interval can be adjusted easily by a user.

What is claimed is:

1. A circuit for stopping a normal response to an input signal by cutting-off said input signal for a predetermined time interval, said circuit comprising:

a first gate means for generating a gate signal corresponding to said predetermined time interval determined by a user in response to said input signal and a control signal corresponding to said predetermined time interval; and a second gate means coupled to said input signal for cutting off said input signal by said predetermined time interval in response to said gate signal and outputting the result.

2. A dead-time generating circuit as claimed in claim 1, wherein said second gate means cuts the forehead of the logic "high" portion of said input signal by said predetermined time interval and outputs the result.

3. A dead-time generating circuit comprising:

a first D-flipflop for receiving an input signal to be cut by a predetermined time interval at a clock port, receiving a logic "high" state at a preset port and a D-input port, and applying a first gate signal to a clear port, to output a second gate signal;

an up/down counter for starting counting operation by the second gate signal, down-counting counted input values loaded to N data input ports by a predetermined clock signal to output counted output values, and outputting said first gate signal generated when the counted output values are 0;

a means for discretionarily adjusting said counted input values corresponding to said time interval; and a second D-flipflop for receiving said first gate signal at a clock port, and receiving a logic "high" state at a D-input port and a clear port, and receiving a logic "high" state at a preset port, to output a signal obtained by cutting-off the input signal by said time interval.

4. A dead-time generating circuit as claimed in claim 3, wherein said second D-flipflop cuts the forehead of the logic "high" portion of said input signal by said predetermined time interval and output the results.

* * * * *